United States Patent
Oda

(10) Patent No.: US 9,012,910 B2
(45) Date of Patent: Apr. 21, 2015

(54) SEMICONDUCTOR DEVICE, DISPLAY DEVICE, AND SEMICONDUCTOR DEVICE MANUFACTURING METHOD

(71) Applicant: Sharp Kabushiki Kaisha, Osaka-shi, Osaka (JP)

(72) Inventor: Akihiro Oda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/370,804

(22) PCT Filed: Dec. 28, 2012

(86) PCT No.: PCT/JP2012/084178
§ 371 (c)(1),
(2) Date: Jul. 7, 2014

(87) PCT Pub. No.: WO2013/105473
PCT Pub. Date: Jul. 18, 2013

(65) Prior Publication Data
US 2015/0028332 A1 Jan. 29, 2015

(30) Foreign Application Priority Data
Jan. 11, 2012 (JP) ................................. 2012-002779

(51) Int. Cl.
*H01L 29/10* (2006.01)
*H01L 27/12* (2006.01)
*H01L 21/02* (2006.01)
*H01L 29/417* (2006.01)

(52) U.S. Cl.
CPC ........ *H01L 27/1225* (2013.01); *H01L 27/1259* (2013.01); *H01L 21/02565* (2013.01); *H01L 29/41733* (2013.01)

(58) Field of Classification Search
CPC ........................ H01L 29/7869; H01L 27/1225
USPC ........ 257/43, 59, E29.296, E29.273; 438/104
See application file for complete search history.

(56) References Cited

U.S. PATENT DOCUMENTS

2006/0043447 A1* 3/2006 Ishii et al. .................... 257/295
2009/0001374 A1 1/2009 Inoue et al.
(Continued)

FOREIGN PATENT DOCUMENTS

JP 2007-258675 A 10/2007
JP 2008-166716 A 7/2008
(Continued)

OTHER PUBLICATIONS

Official Communication issued in International Patent Application No. PCT/JP2012/084178, mailed on Apr. 2, 2013.

*Primary Examiner* — Tucker Wright
(74) *Attorney, Agent, or Firm* — Keating & Bennett, LLP

(57) ABSTRACT

This semiconductor device (100) includes a substrate (1), a gate electrode (11), a gate insulating film (12), an oxide semiconductor layer (13), a source electrode (14), a drain electrode (15), and a protective film (16). The upper and side surfaces of the oxide semiconductor layer are covered with the source and drain electrodes and the protective film. When viewed along a normal to the substrate, the narrowest gap between the respective outer peripheries of a first contact region (13*s*) and the source electrode and the narrowest gap between the respective outer peripheries of a second contact region (13*d*) and the drain electrode both have a length of 1.5 μm to 4.5 μm.

14 Claims, 12 Drawing Sheets

(56) References Cited

U.S. PATENT DOCUMENTS

2010/0051936 A1 3/2010 Hayashi et al.
2010/0193784 A1 8/2010 Morosawa et al.
2012/0138922 A1 6/2012 Yamazaki et al.

FOREIGN PATENT DOCUMENTS

| JP | 2010-182818 A | 8/2010 |
| JP | 2012-134475 A | 7/2012 |

* cited by examiner (a)

(b)

(c)

(a)

(b)

(c)

(a)

(b)

(a)

(b)

(a)

(b)

SEMICONDUCTOR DEVICE, DISPLAY DEVICE, AND SEMICONDUCTOR DEVICE MANUFACTURING METHOD

TECHNICAL FIELD

The present invention relates to a semiconductor device and more particularly relates to a semiconductor device including an oxide semiconductor TFT. The present invention also relates to a display device including such a semiconductor device and a method for fabricating such a semiconductor device.

BACKGROUND ART

An active-matrix substrate for use in a liquid crystal display device and other devices includes switching elements such as thin-film transistors (which will be simply referred to herein as "TFTs"), each of which is provided for an associated one of pixels. As such switching elements, a TFT that uses an amorphous silicon film as its active layer (and will be referred to herein as an "amorphous silicon TFT") and a TFT that uses a polysilicon film as its active layer (and will be referred to herein as a "polysilicon TFT") have been used extensively.

In a polysilicon film, electrons and holes have higher mobility than in an amorphous silicon film. That is why a polysilicon TFT has a larger ON-state current, and can operate faster, than an amorphous silicon TFT. Consequently, if an active-matrix substrate is made using polysilicon TFTs, the polysilicon TFTs can be used not only as switching elements but also in a driver and other peripheral circuits as well. As a result, part or all of the driver and other peripheral circuits and the display section can be integrated together on the same substrate, which is beneficial. In addition, the pixel capacitor of a liquid crystal display device, for example, can be charged in a shorter switching time as well, which is also advantageous.

If a polysilicon TFT is to be fabricated, however, the process step of crystallizing an amorphous silicon film with a laser beam or heat, a thermal annealing process step, and other complicated process steps should be carried out, thus raising the manufacturing cost per unit area of the substrate. For that reason, polysilicon TFTs are currently used mostly in small- and middle-sized liquid crystal display devices.

Meanwhile, an amorphous silicon film can be formed more easily than a polysilicon film, and therefore, can be used more suitably to make a device with a huge area. That is why amorphous silicon TFTs can be used effectively to make an active-matrix substrate of an apparatus that needs a big display area. In spite of their smaller ON-state current than polysilicon TFTs, amorphous silicon TFTs are currently used in the active-matrix substrate of most LCD TVs.

Nevertheless, if amorphous silicon TFTs are used, the mobility of the amorphous silicon film is too low (specifically, $0.5\ cm^2/Vs$ or less) to enhance their performance unlimitedly. Generally speaking, a liquid crystal display device such as an LCD TV must realize not just a huge display screen but also much higher image quality and far lower power dissipation as well. For that reason, it should be difficult for an amorphous silicon TFT to meet all of these expectations fully. Also, recently, there have been increasing a demand for driver-monolithic substrates to make the frame area as narrow as possible and cut down the cost as much as one can, and another demand for further performance enhancement by introducing a touchscreen panel function. However, it is difficult for an amorphous silicon TFT to meet these demands sufficiently.

Thus, to realize a TFT of even higher performance with the number of manufacturing processing steps and the manufacturing cost cut down, materials other than amorphous silicon and polysilicon have been tentatively used for the active layer of a TFT.

Patent Documents Nos. 1 and 2 propose making the active layer of a TFT of an oxide semiconductor film of zinc oxide, for example. Such a TFT will be referred to herein as an "oxide semiconductor TFT". An oxide semiconductor has higher mobility (of about $10\ cm^2/Vs$, for example) than amorphous silicon. That is why an oxide semiconductor TFT can operate faster than an amorphous silicon TFT. On top of that, an oxide semiconductor film can be formed through a simpler process than a polysilicon film, and therefore, can be used to make a device that should have a huge display area.

However, depending on the structure of the oxide semiconductor TFT, the oxide semiconductor film could be damaged so easily during the manufacturing process that the performance of the transistor could deteriorate eventually. For example, in an oxide semiconductor TFT with a bottom gate, top contact structure, when its source/drain electrodes are formed by patterning, a dry etching process is usually performed using a halogen gas such as a fluorine gas or a chlorine gas. In that case, however, the oxide semiconductor film will be exposed to halogen plasma, thus dissociating oxygen atoms from the oxide semiconductor film and causing some deterioration in performance (such as deterioration of the OFF-state characteristic due to a decrease in channel resistance).

Thus, to overcome such a problem, Patent Document Nos. 1 and 2 propose covering the channel region of an active layer made of an oxide semiconductor with an insulating film that functions as an etch stop layer (as a channel protective film).

FIG. 13 illustrates a cross-sectional structure for a known oxide semiconductor TFT 10A with such a channel protective film. The oxide semiconductor TFT 10A includes a substrate 1, a gate electrode 11 provided on the substrate 1, a gate insulating film 12 which covers the gate electrode 11, an oxide semiconductor layer 13 formed on the gate insulating film 12, a channel protective film 16 which has been formed over the channel region of the oxide semiconductor layer 13, and source and drain electrodes 14 and 15 arranged on the oxide semiconductor layer 13. The source and drain electrodes 14 and 15 are electrically connected to the oxide semiconductor layer 13.

In the process of fabricating an oxide semiconductor TFT 10A such as the one shown in FIG. 13, when the source and drain electrodes 14 and 15 are formed by patterning a metal film, the channel region of the oxide semiconductor layer 13 is protected with the channel protective film 16. Thus, it is possible to prevent the channel region of the oxide semiconductor layer 13 from getting damaged.

However, just by providing a channel protective film such as the one disclosed in Patent Documents Nos. 1 and 2, the reliability of an oxide semiconductor TFT cannot be increased sufficiently for the reasons to be described below.

An oxide semiconductor film has the property of having a carrier concentration which varies significantly when adsorbing water. That is why if an oxide semiconductor TFT were left in a high-temperature and high-humidity environment, water would diffuse to reach its channel region to deteriorate the transistor characteristic seriously.

Thus, a technique for preventing water from being adsorbed into the oxide semiconductor layer of an oxide semiconductor TFT is disclosed in Patent Document No. 3. FIGS. 14(a) and 14(b) illustrate an oxide semiconductor TFT 10B as disclosed in Patent Document No. 3. Specifically, FIG.

14(*a*) is a plan view schematically illustrating the oxide semiconductor TFT 10B and FIG. 14(*b*) is a cross-sectional view as viewed on the plane 14B-14B' shown in FIG. 14(*a*).

In this oxide semiconductor TFT 10B, its gate insulating film 12 has a multilayer structure including a silicon nitride layer 12*c* and a silicon oxide layer 12*d* which has been formed on the silicon nitride layer 12*c*. However, the silicon oxide layer 12*d* has been formed selectively only in a region where there is the oxide semiconductor layer 13. That is to say, the gate insulating film 12 has the multilayer structure only where there is the oxide semiconductor layer 13 but has a single-layer structure everywhere else.

On the silicon nitride layer 12*c* of the gate insulating film 12, the upper and side surfaces of the oxide semiconductor layer 13 and the side surface of the silicon oxide layer 12*d* of the gate insulating film 12 are covered with source and drain electrodes 14, 15 and a channel protective film 16.

The channel protective film 16 has a triple layer structure in which first, second and third layers 16*c*, 16*d* and 16*e* have been stacked one upon the other in this order. Each of the first, second and third layers 16*c*, 16*d* and 16*e* may be an aluminum oxide layer, a silicon nitride layer or a silicon oxynitride layer. At least one of the second and third layers 16*d* and 16*e* is either an aluminum oxide layer or a silicon nitride layer.

In this oxide semiconductor TFT 10B, since the upper and side surfaces of the oxide semiconductor layer 13 and the side surface of the silicon oxide layer 12*d* are covered with the source and drain electrodes 14, 15 and the channel protective film 16 on the silicon nitride layer 12*c*, water to be adsorbed into the oxide semiconductor layer 13 can be reduced. In addition, in this oxide semiconductor TFT 10B, since the silicon oxide layer 12*d* has been formed where there is the oxide semiconductor layer 13, a good device interface is formed between the silicon oxide layer 12*d* and the oxide semiconductor layer 13, and it is possible to prevent lattice defects from being caused in the oxide semiconductor layer 13.

CITATION LIST

Patent Literature

Patent Document No. 1: Japanese Laid-Open Patent Publication No. 2008-166716
Patent Document No. 2: Japanese Laid-Open Patent Publication No. 2007-258675
Patent Document No. 3: Japanese Laid-Open Patent Publication No. 2010-182818

SUMMARY OF INVENTION

Technical Problem

However, the present inventor discovered and confirmed via experiments that just by covering the upper and side surfaces of the oxide semiconductor layer 13 with the source and drain electrodes 14, 15 and the channel protective film 16 as in the technique disclosed in Patent Document No. 3, water to be adsorbed into the oxide semiconductor layer 13 could not be reduced sufficiently.

In addition, according to the technique of Patent Document No. 3, the channel protective film 16 needs to include either an aluminum oxide layer or a silicon nitride layer. However, aluminum oxide is difficult to pattern as intended. Meanwhile, a silicon nitride layer is likely to cause fixed charges (which are a factor in deterioration of the transistor performance) by itself.

Furthermore, according to the technique of Patent Document No. 3, to make the gate insulating film 12 have such a multilayer structure only in a region where there is the oxide semiconductor layer 13 (but have a single layer structure everywhere else), an additional process step of etching the silicon oxide layer 12*d* should be performed, which would cause an increase in manufacturing cost.

Thus, the present inventor perfected our invention in order to overcome these problems by increasing the reliability of a semiconductor device with an oxide semiconductor TFT using a relatively simple configuration.

Solution to Problem

A semiconductor device according to a preferred embodiment of the present invention includes: a substrate; a gate electrode provided on the substrate; a gate insulating film formed on the gate electrode; an islanded oxide semiconductor layer formed on the gate insulating film and including a channel region and first and second contact regions that are arranged to interpose the channel region between them; a source electrode electrically connected to the first contact region; a drain electrode electrically connected to the second contact region; and a protective film formed on and in contact with the oxide semiconductor layer and arranged between the oxide semiconductor layer and the source and drain electrodes. The upper and side surfaces of the oxide semiconductor layer are covered with the source electrode, the drain electrode and the protective film. When viewed along a normal to the substrate, the narrowest gap between the respective outer peripheries of the first contact region and the source electrode and the narrowest gap between the respective outer peripheries of the second contact region and the drain electrode both have a length of 1.5 μm to 4.5 μm.

In one preferred embodiment, when viewed along a normal to the substrate, the gap between the respective outer peripheries of the first contact region and the source electrode and the gap between the respective outer peripheries of the second contact region and the drain electrode both have a length of 1.5 μm to 4.5 μm as measured in a channel length direction.

In one preferred embodiment, when viewed along a normal to the substrate, the gap between the respective outer peripheries of the first contact region and the source electrode and the gap between the respective outer peripheries of the second contact region and the drain electrode both have a width of 1.5 μm to 4.5 μm as measured in a channel width direction.

In one preferred embodiment, when viewed along a normal to the substrate, the narrowest gap between the respective outer peripheries of the first contact region and the source electrode and the narrowest gap between the respective outer peripheries of the second contact region and the drain electrode both have a length of 2.0 μm to 3.5 μm.

In one preferred embodiment, the protective film includes an oxide layer.

In one preferred embodiment, the protective film includes a silicon oxide layer.

In one preferred embodiment, the protective film includes neither an aluminum oxide layer nor a silicon nitride layer.

In one preferred embodiment, the gate insulating film has either a single-layer structure or a multilayer structure almost everywhere.

In one preferred embodiment, the semiconductor device further includes a passivation film formed so as to cover the source and drain electrodes, and the passivation film includes a silicon oxide layer and a silicon nitride layer which has been stacked on the silicon oxide layer.

In one preferred embodiment, the semiconductor device is an active-matrix substrate.

A display device according to a preferred embodiment of the present invention includes a semiconductor device according to any of the preferred embodiments described above.

A method for fabricating a semiconductor device according to a preferred embodiment of the present invention includes the steps of: (A) forming a gate electrode on a substrate; (B) forming a gate insulating film to cover the gate electrode; (C) forming an islanded oxide semiconductor layer on the gate insulating film; (D) forming a protective film with first and second holes on the oxide semiconductor layer; and (E) forming a source electrode and a drain electrode electrically connected to the oxide semiconductor layer through the first and second holes, respectively. The steps (D) and (E) are performed so that the upper and side surfaces of the oxide semiconductor layer are covered with the source and drain electrodes and the protective film. The step (E) is performed so that when viewed along a normal to the substrate, the narrowest gap between the respective outer peripheries of the first hole and the source electrode and the narrowest gap between the respective outer peripheries of the second hole and the drain electrode both have a length of 1.5 µm to 4.5 µm.

Advantageous Effects of Invention

According to embodiments of the present invention, the reliability of a semiconductor device with an oxide semiconductor TFT can be increased with a relatively simple configuration.

DESCRIPTION OF EMBODIMENTS

Hereinafter, embodiments of the present invention will be described with reference to the accompanying drawings. A semiconductor device according to the present invention includes a thin-film transistor with an active layer made of an oxide semiconductor (which will be referred to herein as an "oxide semiconductor TFT"). A semiconductor device according to the present invention just needs to include at least one oxide semiconductor TFT and may be implemented as any of various substrates, display devices and other electronic devices that use such TFTs. In the following description, the semiconductor device of the present inventions is supposed to be implemented as an active-matrix substrate (TFT substrate) for a display device (such as a liquid crystal display device).

Figure 1:
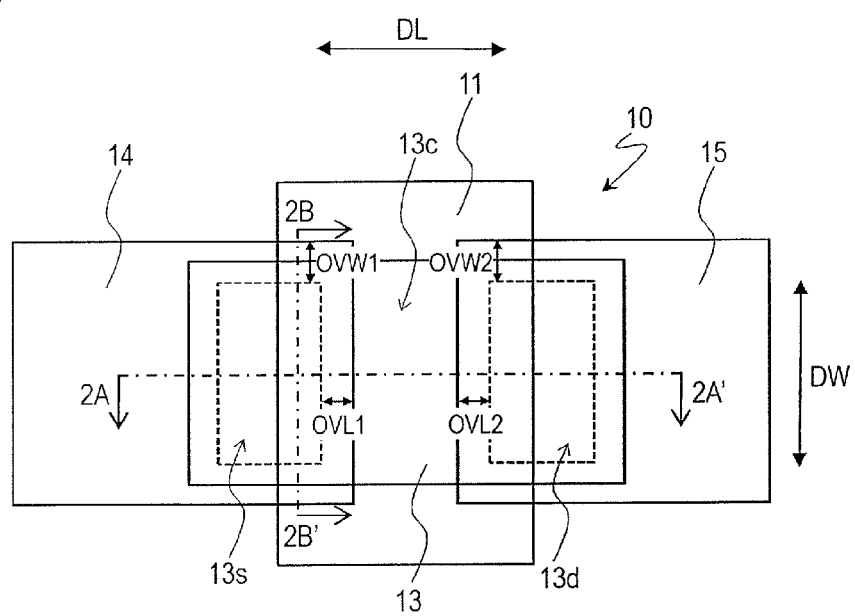
FIG. 1 A plan view schematically illustrating a thin-film transistor 10 included in a semiconductor device (TFT substrate) according to a preferred embodiment of the present invention.

The structure of a thin-film transistor 10 included in a semiconductor device according to a preferred embodiment of the present invention (which is a TFT substrate) will be described with reference to FIGS. 1 and 2. FIG. 1 is a plan view schematically illustrating a thin-film transistor 10. FIGS. 2(a) and 2(b) are cross-sectional views as respectively viewed on the planes 2A-2A' and 2B-2B' shown in FIG. 1, in which illustration of some components is omitted.

The thin-film transistor 10 is provided on the substrate 1 (which is typically a transparent substrate) of this semiconductor device. The substrate 1 has an electrically insulating property and may be a glass substrate, for example.

The thin-film transistor 10 includes a gate electrode 11 provided on the substrate 1, a gate insulating film 12 formed on the gate electrode 11, an islanded oxide semiconductor layer 13 formed on the gate insulating film 12, and source and drain electrodes 14 and 15 electrically connected to the oxide semiconductor layer 13. The thin-film transistor 10 further includes a protective film (i.e., a channel protective film) 16 formed on, and in contact with, the oxide semiconductor layer 13 and arranged between the oxide semiconductor layer 13 and the source and drain electrodes 14 and 15. Furthermore, a passivation film 17 is formed to cover this thin-film transistor 10.

In the exemplary configuration shown in FIGS. 2(a) and 2(b), the gate insulating film 12 has a multilayer structure including first and second insulating layers 12a and 12b which are made of mutually different insulating materials.

Both of the source and drain electrodes 14, 15 contact with the upper surface of the oxide semiconductor layer 13. A region 13s of the oxide semiconductor layer 13 which contacts with the source electrode 14 will be referred to herein as either a "first contact region" or a "source region". A region 13d of the oxide semiconductor layer 13 which contacts with the drain electrode 15 will be referred to herein as either a "second contact region" or a "drain region". And a region 13c of the oxide semiconductor layer 13 which overlaps with the gate electrode 11 and which is located between the source and drain regions 13s and 13d will be referred to herein as a "channel region". That is to say, the oxide semiconductor layer 13 includes a channel region 13c and first and second contact regions 13s and 13d which interpose the channel region 13c between them. The source and drain electrodes 14 and 15 are respectively electrically connected to the source and drain regions 13s and 13d of the oxide semiconductor layer 13. In this description, in a plane which is parallel to the substrate 1, a direction DL which is parallel to the direction in which current flows through the channel region 13c will be referred to herein as a "channel length direction" and a direction DW which intersects with the channel length direction at right angles will be referred to herein as a "channel width direction".

In the thin-film transistor 10 of this embodiment, the upper and side surfaces of the oxide semiconductor layer 13 are covered with the source and drain electrodes 14, 15 and the protective film 16 as shown in FIGS. 1, 2(a) and 2(b). Although illustration of the protective film 16 is omitted in FIG. 1, a portion of the upper and side surfaces of the oxide semiconductor layer 13 which is not covered with the source and drain electrodes 14, 15 is covered with the protective film 16.

Also, in the thin-film transistor 10 of this embodiment, when viewed along a normal to the substrate, the narrowest gap between the respective outer peripheries of the first contact region 13s and the source electrode 14 and the narrowest gap between the respective outer peripheries of the second contact region 13d and the drain electrode 15 both fall within a predetermined range. Specifically, both of those narrowest gaps are supposed to fall within the range of 1.5 µm to 4.5 µm.

Thus, when measured in the channel length direction DL, the gap OVL1 between the respective outer peripheries of the first contact region 13s and the source electrode 14 has a length of 1.5 µm through 4.5 µm (which will be referred to herein as an "overlap length OVL1 in the channel length direction DL" for the source electrode 14). Likewise, when measured in the channel length direction DL, the gap OVL2 between the respective outer peripheries of the second contact region 13d and the drain electrode 15 also has a length of 1.5 µm through 4.5 µm (which will be referred to herein as an "overlap length OVL2 in the channel length direction DL" for the drain electrode 15).

In the same way, when measured in the channel width direction DW, the gap OVW1 between the respective outer peripheries of the first contact region 13s and the source electrode 14 has a width of 1.5 µm through 4.5 µm (which will be referred to herein as an "overlap width OVW1 in the channel width direction DW" for the source electrode 14). Likewise, when measured in the channel width direction DW, the gap OVW2 between the respective outer peripheries of the second contact region 13d and the drain electrode 15 also has a width of 1.5 µm through 4.5 µm (which will be referred to herein as an "overlap width OVW2 in the channel width direction DW" for the drain electrode 15).

As described above, in the thin-film transistor 10 of this embodiment, not only the upper and side surfaces of the oxide semiconductor layer 13 are covered with the source electrode 14, the drain electrode 15 and the protective film 16 but also the source and drain electrodes 14, 15 are laid out so that the overlap lengths OVL1, OVL2 and overlap widths OVW1, OVW2 all fall within the range of 1.5 µm to 4.5 µm. As a result, as will be described later based on results of verification experiments, the humidity resistance of the thin-film transistor 10 and the reliability of the semiconductor device can be increased sufficiently. To further increase the reliability of the semiconductor device, the overlap lengths OVL1, OVL2 and overlap widths OVW1, OVW2 suitably fall within the range of 2.0 µm to 3.5 µm. That is to say, when viewed along a normal to the substrate, the narrowest gap between the respective outer peripheries of the first contact region 13s and the source electrode 14 and the narrowest gap between the respective outer peripheries of the second contact region 13d and the drain electrode 15 both suitably have a length of 2.0 µm to 3.5 µm.

Figure 3:
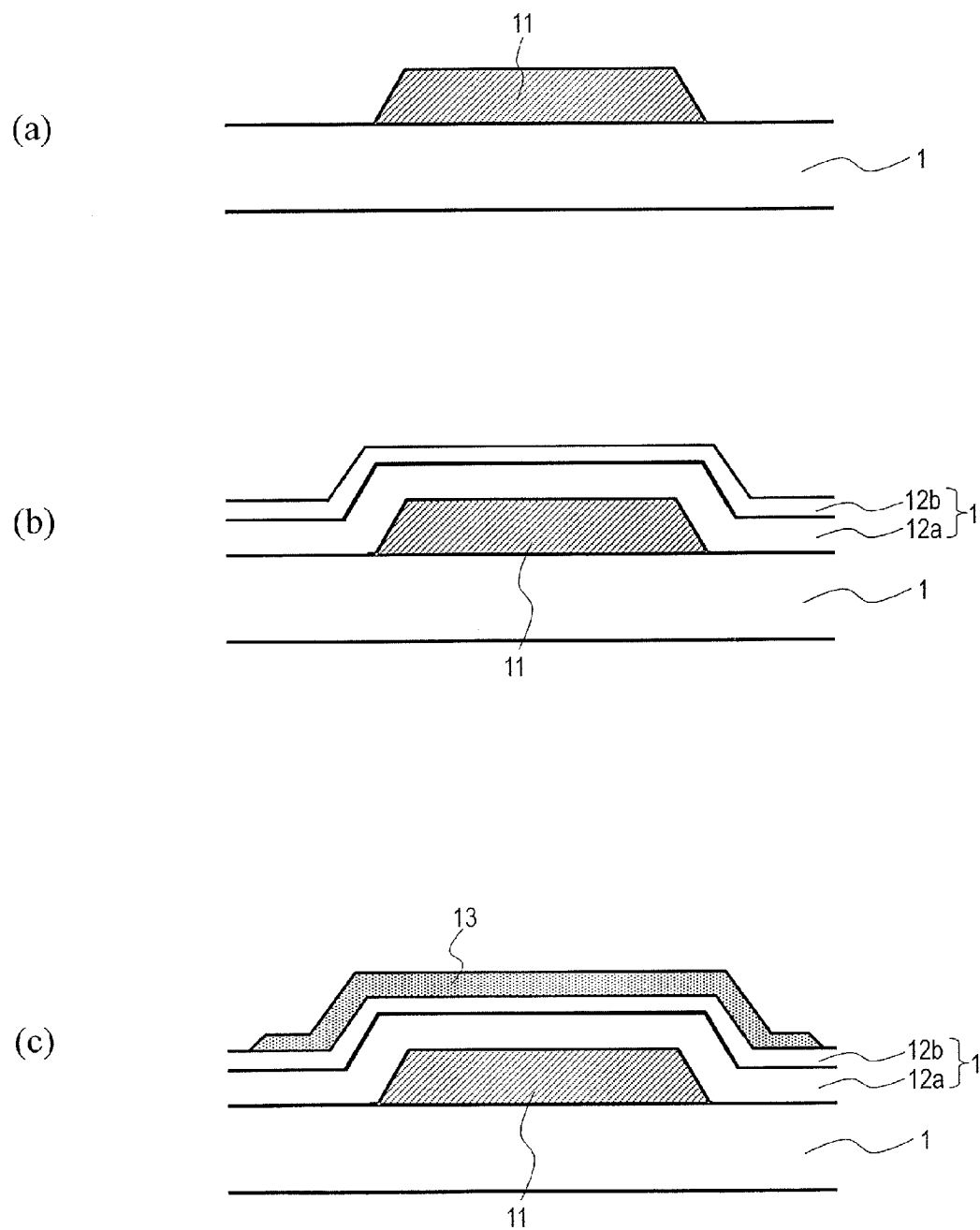
FIG. 3 (a) to (c) are cross-sectional views illustrating respective manufacturing process steps to fabricate the thin-film transistor 10.
Figure 4:
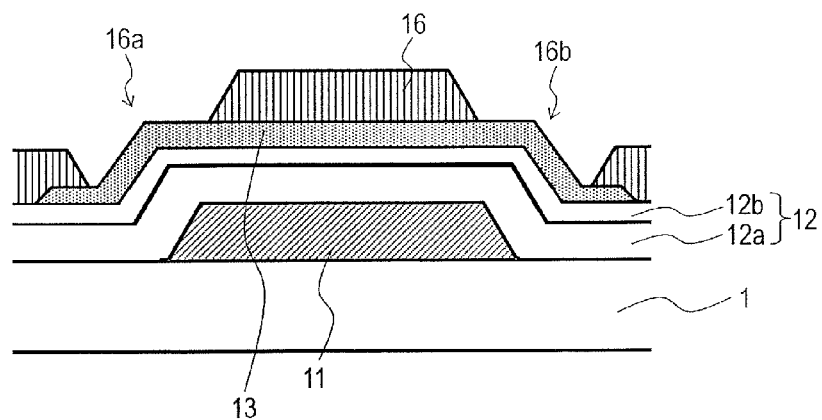
FIG. 4 (a) to (c) are cross-sectional views illustrating respective manufacturing process steps to fabricate the thin-film transistor 10.
Figure 4:
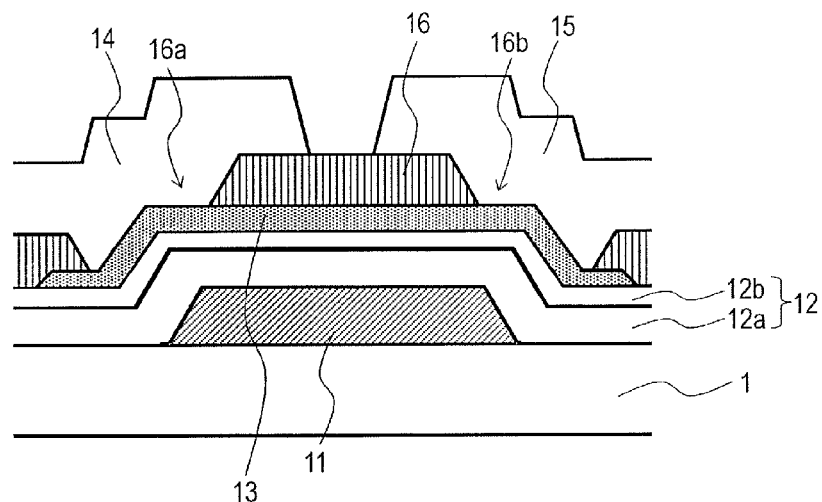
Figure 4:
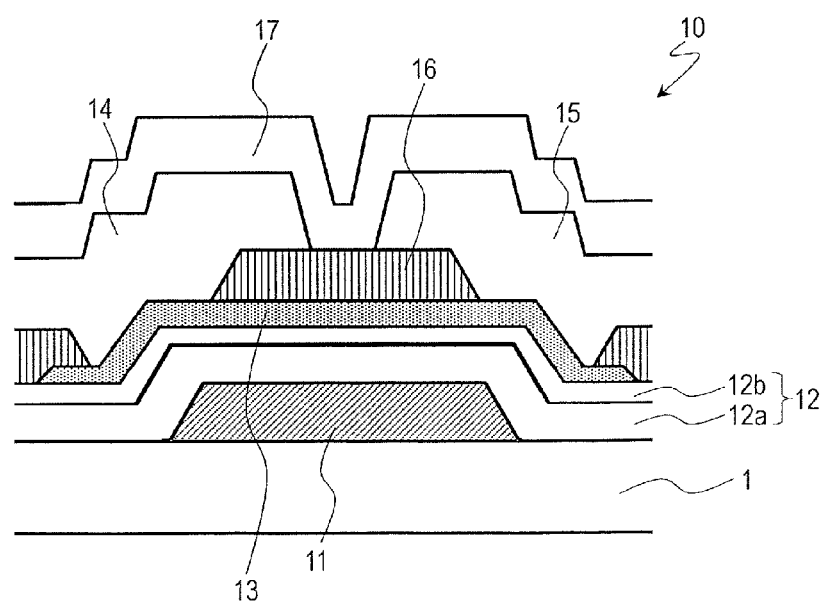
Figure 5:
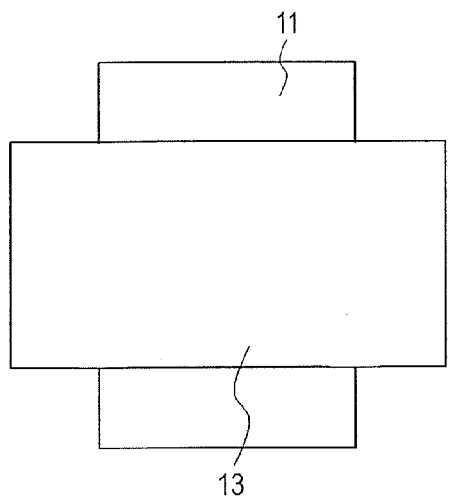
FIG. 5 (a) to (c) are plan views illustrating some of the process steps shown in FIGS. 3 and 4.
Figure 5:
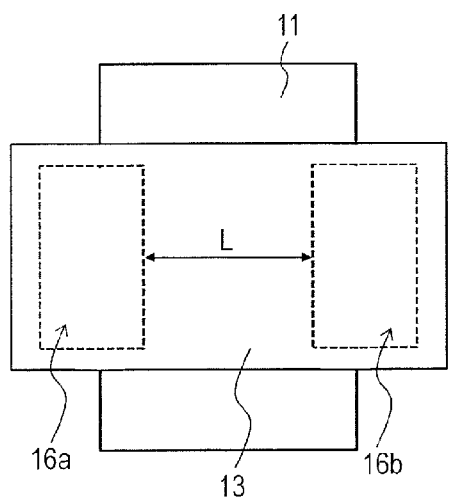
Figure 5:
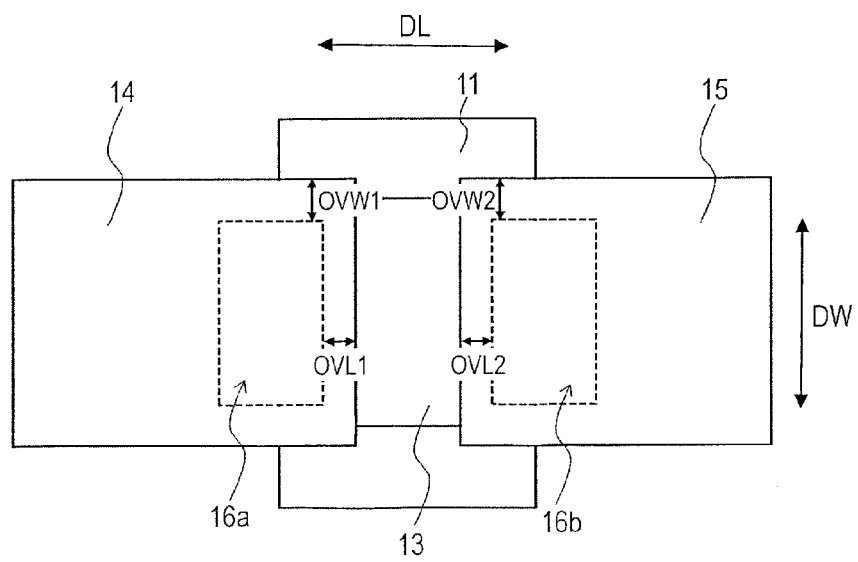

Hereinafter, an exemplary method for fabricating the thin-film transistor 10 will be described with reference to FIGS. 3 through 5. Specifically, FIGS. 3(a) to 3(c) and FIGS. 4(a) to 4(c) are cross-sectional views illustrating respective manufacturing process steps to fabricate the thin-film transistor 10. FIGS. 5(a) to 5(c) are plan views illustrating some of the process steps shown in FIGS. 3 and 4.

First of all, as shown in FIG. 3(a), a gate electrode 11 is formed on a transparent substrate 1. The gate electrode 11 may be formed by depositing a metal film (conductor film) on the substrate 1 by sputtering process, for example, and then by patterning the metal film by photolithographic process. As the conductor film to be the gate electrode 11, a multilayer film in which a Ti layer with a thickness of 10 nm to 100 nm, an Al layer with a thickness of 50 nm to 500 nm, and a Ti layer with a thickness of 50 nm to 300 nm are stacked one upon the other in this order is formed.

Next, as shown in FIG. 3(b), a gate insulating film 12 is deposited to cover the gate electrode 11. The gate insulating film 12 may be deposited by CVD process, for example. In this embodiment, an SiNx layer is deposited to a thickness of 100 to 500 nm as the first insulating layer 12a of the gate insulating film 12 and then an SiOx layer is deposited thereon to a thickness of 10 to 100 nm as the second insulating layer 12b.

Subsequently, as shown in FIGS. 3(c) and 5(a), an islanded oxide semiconductor layer 13 is formed on the gate insulating layer 12. Examples of materials for the oxide semiconductor layer 13 include an In—Ga—Zn—O based semiconductor (which will be referred to herein as "IGZO based semiconductor"), a Zn—O based semiconductor (which will be referred to herein as "ZnO"), an In—Zn—O based semiconductor (which will be referred to herein as "IZO") and a Zn—Ti—O based semiconductor (which will be referred to herein as "ZTO"). In this embodiment, an oxide semiconductor film of an IGZO based semiconductor is deposited to a thickness of 20 to 200 nm by sputtering process and then patterned, thereby forming the oxide semiconductor layer 13. In this case, the IGZO based semiconductor is a ternary oxide of In (indium), Ga (gallium) and Zn (zinc). The ratios (i.e., mole fractions) of In, Ga and Zn are not particularly limited. For example, In:Ga:Zn=2:2:1, In:Ga:Zn=1:1:1 or In:Ga:Zn=1:1:2 may be satisfied. The IGZO based semiconductor may be either amorphous or crystalline. If the IGZO based semiconductor is a crystalline one, a crystalline IGZO based semiconductor of which the c axis is substantially perpendicular to the layer plane is suitably used. The crystal structure of such an IGZO based semiconductor is disclosed, for example, in Japanese Laid-Open Patent Publication No. 2012-134475, the entire disclosure of which is hereby incorporated by reference.

Next, as shown in FIG. 4(a), a protective film 16 which will function as an etch stop layer is formed on the oxide semiconductor layer 13. In this embodiment, first of all, an oxide layer (specifically an SiOx layer) is deposited to a thickness of 30 nm to 200 nm by CVD process. Next, a resist mask which covers a predetermined region of the SiOx layer is formed and the rest of the SiOx layer that is not covered with the resist mask is etched away. After that, the resist mask is stripped, thereby obtaining a protective film 16.

The protective film 16 thus obtained has first and second holes 16a and 16b which expose portions of the oxide semiconductor layer 13 that are located on right- and left-hand sides of a portion of the oxide semiconductor layer 13 to be a channel region 13c as shown in FIG. 4(a). The locations of the first and second holes 16a and 16b are also shown in FIG. 5(b), in which the protective film 16 itself is not shown. The interval L between the first and second holes 16a and 16b (which will define the channel length) is set to be a predetermined value (which typically falls within the range of 6.0 μm to 22.0 μm).

Subsequently, as shown in FIGS. 4(b) and 5(c), source and drain electrodes 14 and 15 are formed so as to be electrically connected to the oxide semiconductor layer 13 through the first and second holes 16a and 16b, respectively. A portion of the oxide semiconductor layer 13 which contacts with the source electrode 14 inside the first hole 16a will be a first contact region 13s, and another portion of the oxide semiconductor layer 13 which contacts with the drain electrode 15 inside the second hole 16b will be a second contact region 13d. The source and drain electrodes 14 and 15 may be formed by depositing a metal film (conductor film) by sputtering process, for example, and then patterning the metal film. In this embodiment, as a conductor film to be the source and drain electrodes 14 and 15, formed is a multilayer film in which Ti, Al and Ti layers deposited to a thickness of 10 nm to 100 nm, a thickness of 50 nm to 400 nm, and a thickness of 50 nm to 300 nm, respectively, are stacked one upon the other in this order.

The process step of forming the protective film 16 and the process step of forming the source and drain electrodes 14 and 15 are performed so that the upper and side surfaces of the oxide semiconductor layer 13 are covered with the source and drain electrodes 14 and 15 and the protective film 16.

Also, this process step of forming the source and drain electrodes 14 and 15 is performed so that when viewed along a normal to the substrate, the narrowest gap between the respective outer peripheries of the first hole 16a and the source electrode 14 and the narrowest gap between the respective outer peripheries of the second hole 16b and the drain electrode 15 both have a length of 1.5 μm to 4.5 μm. That is to say, this process step is performed so that the overlap lengths OVL1, OVL2 and overlap widths OVW1, OVW2 described above all fall within the range of 1.5 μm to 4.5 μm.

Next, a passivation film 17 is formed as shown in FIG. 4(c) and then an annealing process is carried out. In this embodiment, an SiOx layer is deposited to a thickness of 100 to 500 nm by CVD process, for example, and then an annealing process is carried out at 350° C. for 0.5 to 2 hours in the air ambient. In this manner, a thin-film transistor 10 is completed.

The present inventor actually made a thin-film transistor 10 according to this embodiment as a specific example of this embodiment and subjected the transistor to a humidity resistance test. The results will be described below along with results of a humidity resistance test which was carried out on a thin-film transistor as a comparative example (which was naturally an oxide semiconductor TFT).

Figure 6:
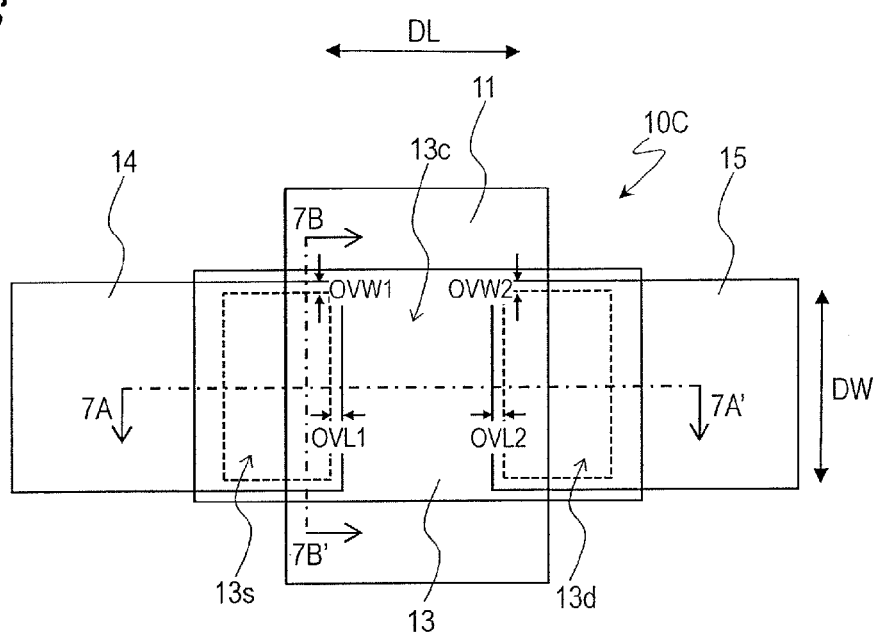
FIG. 6 A plan view schematically illustrating a thin-film transistor 10C as a comparative example.
Figure 7:
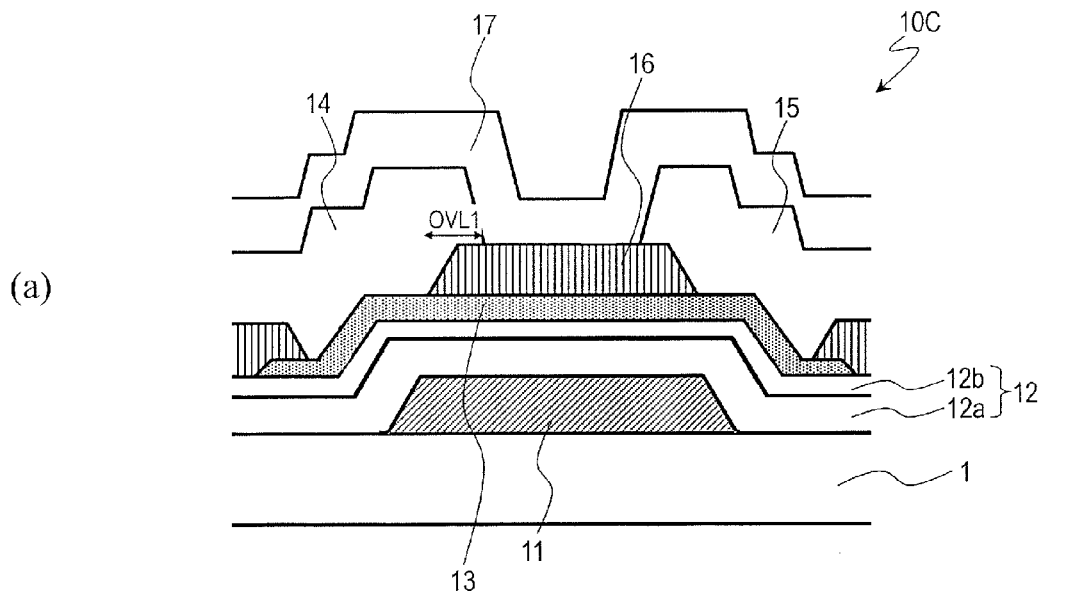
FIGS. 7 (a) and (b) are cross-sectional views schematically illustrating the thin-film transistor 10C as respectively viewed on the planes 7A-7A' and 7B-7B' shown in FIG. 6.
Figure 7:
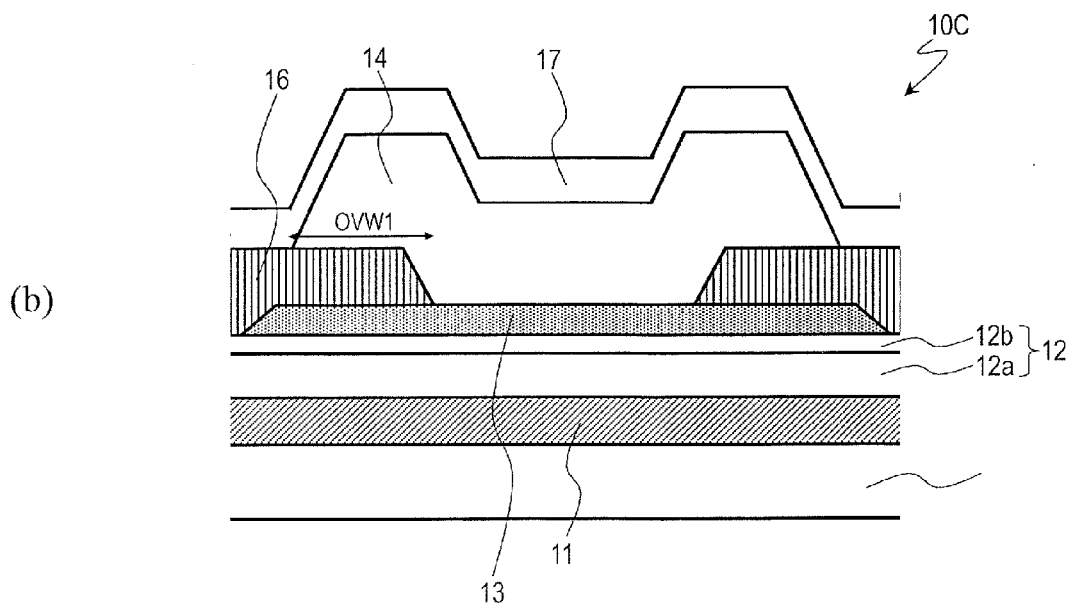

Specifically, a thin-film transistor 10C such as the one shown in FIGS. 6 and 7 was made as a comparative example. FIG. 6 is a plan view schematically illustrating a thin-film transistor 10C as a comparative example. FIGS. 7(a) and 7(b) are cross-sectional views as respectively viewed on the planes 7A-7A' and 7B-7B' shown in FIG. 6.

In the thin-film transistor 10C of this comparative example, the source and drain electrodes 14 and 15 are laid out differently from the thin-film transistor 10 of the specific example of this embodiment. As shown in FIG. 1 and other drawings, in the thin-film transistor 10 of the specific example, the width of the source and drain electrodes 14 and 15 as measured in the channel width direction DW is broader than that of the oxide semiconductor layer 13 as measured in the channel width direction DW. That is to say, the source and drain electrodes 14 and 15 are arranged so as to overhang the oxide semiconductor layer 13 in the channel width direction DW. On the other hand, in the thin-film transistor 10C of the comparative example, the width of the source and drain electrodes 14 and 15 as measured in the channel width direction DW is narrower than that of the oxide semiconductor layer 13 as measured in the channel width direction DW. That is to say, the source and drain electrodes 14 and 15 are arranged so as not to overhang the oxide semiconductor layer 13 in the channel width direction DW.

Also, in the thin-film transistor 10C of the comparative example, when viewed along a normal to the substrate, the narrowest gap between the respective outer peripheries of the first contact region 13s and the source electrode 14 and the narrowest gap between the respective outer peripheries of the second contact region 13d and the drain electrode 15 both have a length of 0.3 μm. That is to say, the overlap lengths OVL1, OVL2 and overlap widths OVW1, OVW2 are 0.3 μm.

It should be noted that the thin-film transistor 10 of the specific example and the thin-film transistor 10C of the comparative example are supposed to have the same configuration (in terms of the materials, thicknesses and sizes of the respective layers) other than the size and layout of the source and drain electrodes 14 and 15.

Figure 8:
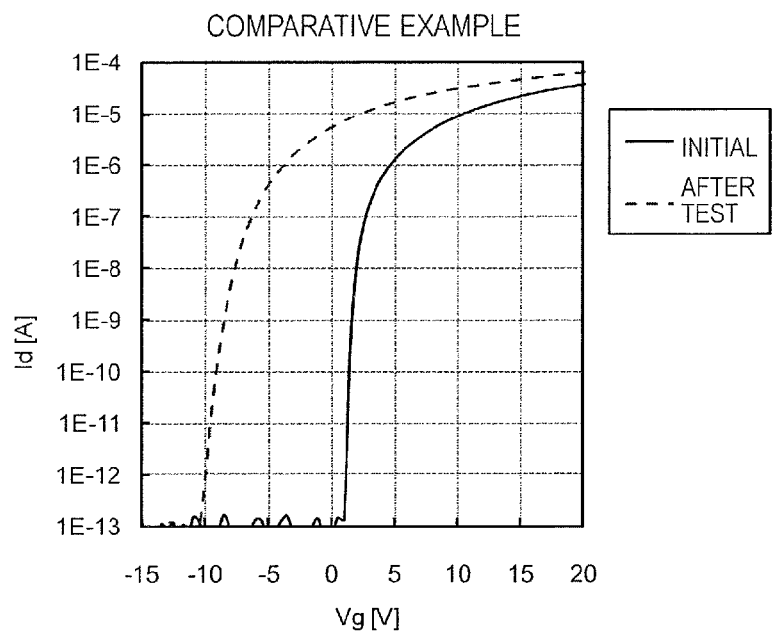
FIG. 8 A graph showing the results of a humidity resistance test (the Vg-Id characteristics before and after the test) which was carried out on the thin-film transistor 10C as a comparative example.
Figure 9:
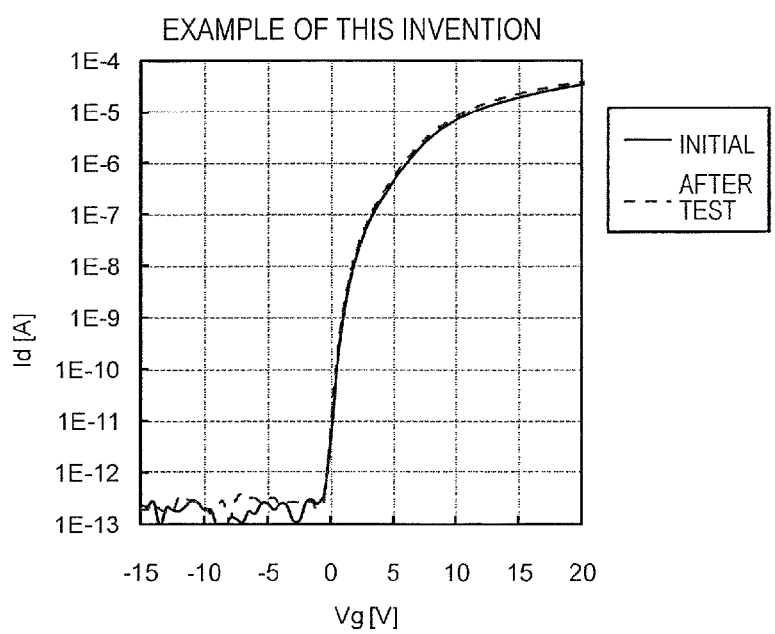
FIG. 9 A graph showing the results of a humidity resistance test (the Vg-Id characteristics before and after the test) which was carried out on the thin-film transistor 10 as a specific example of the present invention.

The humidity resistance test was carried out by exposing each of the thin-film transistor 10 of the specific example and the thin-film transistor 10C of the comparative example to an environment at 134° C., 3 atm and RH of 100% for 18 hours, applying stress to them at 60° C. and −30 V for an hour, and then measuring their gate voltage-drain current (Vg-Id) characteristic. Naturally, their Vg-Id characteristic in the initial value state was also measured. The results of evaluation obtained from the thin-film transistor 10C of the comparative example are shown in FIG. 8. On the other hand, the results of evaluation obtained from the thin-film transistor 10 of the specific example are shown in FIG. 9.

As can be seen from FIG. 8, in the thin-film transistor 10C of the comparative example, the Vg-Id characteristic after the test significantly shifted in the negative direction compared to its initial Vg-Id characteristic. This result was obtained probably because water would have been adsorbed into the oxide semiconductor layer 13 due to exposure of the thin-film transistor 10C to the high-temperature, high-humidity environment. On the other hand, the Vg-Id characteristic of the thin-film transistor 10 of the specific example hardly shifted before and after the test as can be seen from FIG. 9.

Figure 10:
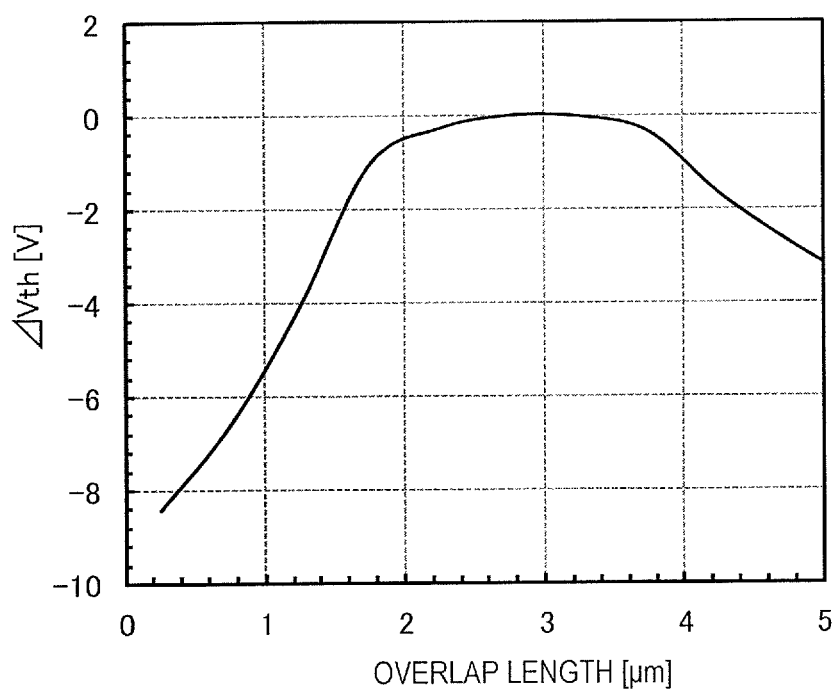
FIG. 10 A graph showing how the variation ΔVth in threshold value before and after the test changed with the overlap length of the source and drain electrodes 14 and 15.

Meanwhile, FIG. 10 shows how the variation ΔVth in threshold value before and after the test changed with the overlap length (which is any of the lengths and widths OVL1, OVL2, OVW1 and OVW2 shown in FIG. 1 and other drawings).

As can be seen from FIG. 10, there is a correlation between the overlap length and the variation ΔVth in threshold value, and the absolute value of the threshold value variation ΔVth can be as small as 3.0 or less (i.e., the reliability can be increased sufficiently) by setting the overlap length to be within the range of 1.5 μm to 4.5 μm. It can also be seen that by setting the overlap length to be within the range of 2.0 μm to 3.5 μm, the absolute value of the threshold value variation ΔVth can be further reduced to almost zero (e.g., 0.3 or less). It should be noted that the evaluation result shown in FIG. 9 was obtained when the overlap length was 3.0 μm.

As can be seen, there is a preferred overlap length range in which a sufficiently high degree of reliability can be achieved for the following reasons.

The decrease in reliability as shown in FIG. 8 was caused probably because the water that had diffused and been adsorbed into the oxide semiconductor layer 13 would have produced an impurity level or fixed charges. However, as the size of the source and drain electrodes 14 and 15 is increased (i.e., as the overlap length is increased), the size of the portion of the oxide semiconductor layer 13 that is covered with the source and drain electrodes 14 and 15 increases, thus preventing water from diffusing toward the oxide semiconductor layer 13 and decreasing the quantity of the water adsorbed. In addition, a potential applied to the source and drain electrodes 14 and 15 that have been expanded also decreases the quantity of the fixed charges generated. These effects can be achieved sufficiently by setting the overlap length to be at least equal to 1.5 μm, and can be achieved more significantly by setting the overlap length to be 2.0 μm or more.

However, if the overlap length was increased too much, the quantity of water adsorbed would decrease but the area of overlap between the source and drain electrodes 14, and the gate electrode 11 would be too large to avoid increasing fixed charges due to factors other than water, thus eventually decreasing the reliability. To avoid such a decrease in reliability, the overlap length is suitably at most 4.5 μm, and more suitably 3.5 μm or less.

It should be noted that as the overlap length increases, the parasitic capacitance of a TFT increases. For that reason, in a general oxide semiconductor TFT, the overlap length is set to be as small as possible with a sufficient pattern overlap margin secured between the source and drain electrodes and the protective film. Specifically, the overlap length is set to be at least equal to 0.5 μm but as small as possible (i.e., less than 1.5 μm). As can be seen, according to the present invention, the overlap length is set from a quite different standpoint from the conventional one in the related art, thus achieving the effect of increasing the reliability significantly.

As described above, not only the upper and side surfaces of the oxide semiconductor layer 13 are covered with the source and drain electrodes 14, 15 and the protective film 16 but also the source and drain electrodes 14, 15 are laid out so that the overlap lengths OVL1, OVL2 and overlap widths OVW1, OVW2 fall within the range of 1.5 μm to 4.5 μm. As a result, the humidity resistance of the thin-film transistor 10 and the reliability of the semiconductor device can be increased sufficiently.

In addition, the thin-film transistor 10 of this embodiment can increase the humidity resistance effectively just by changing the layout of the source and drain electrodes 14 and 15 without using any special material or process. That is why according to the present invention, highly reliable oxide semiconductor TFTs with stabilized transistor performance can be obtained at a good yield. On top of that, such high-performance TFTs can be mass-produced without introducing any new system to cope with a special material or process, which is advantageous in terms of manufacturing cost, too.

It should be noted that the protective film 16 suitably includes an oxide layer such as a silicon oxide (SiOx) layer. If the protective film 16 includes an oxide layer, even an oxygen deficiency produced in the oxide semiconductor layer 13 can be made up for with oxygen included in the oxide layer. As a result, the oxygen deficiency of the oxide semiconductor layer 13 can be reduced significantly.

Furthermore, the protective film 16 suitably includes neither an aluminum oxide layer nor a silicon nitride layer, because aluminum oxide is difficult to pattern as intended and because a silicon nitride layer is likely to cause fixed charges by itself.

The protective film 16 suitably has a thickness of 50 nm to 200 nm. If its thickness is at least equal to 50 nm, the surface of the oxide semiconductor layer 13 can be protected more securely in the process step of patterning the source and drain electrodes 14 and 15. However, if its thickness exceeded 200 nm, the level difference to be made on the source and drain electrodes 14, 15 would be so high that disconnection and other inconveniences could be caused.

Figure 2:
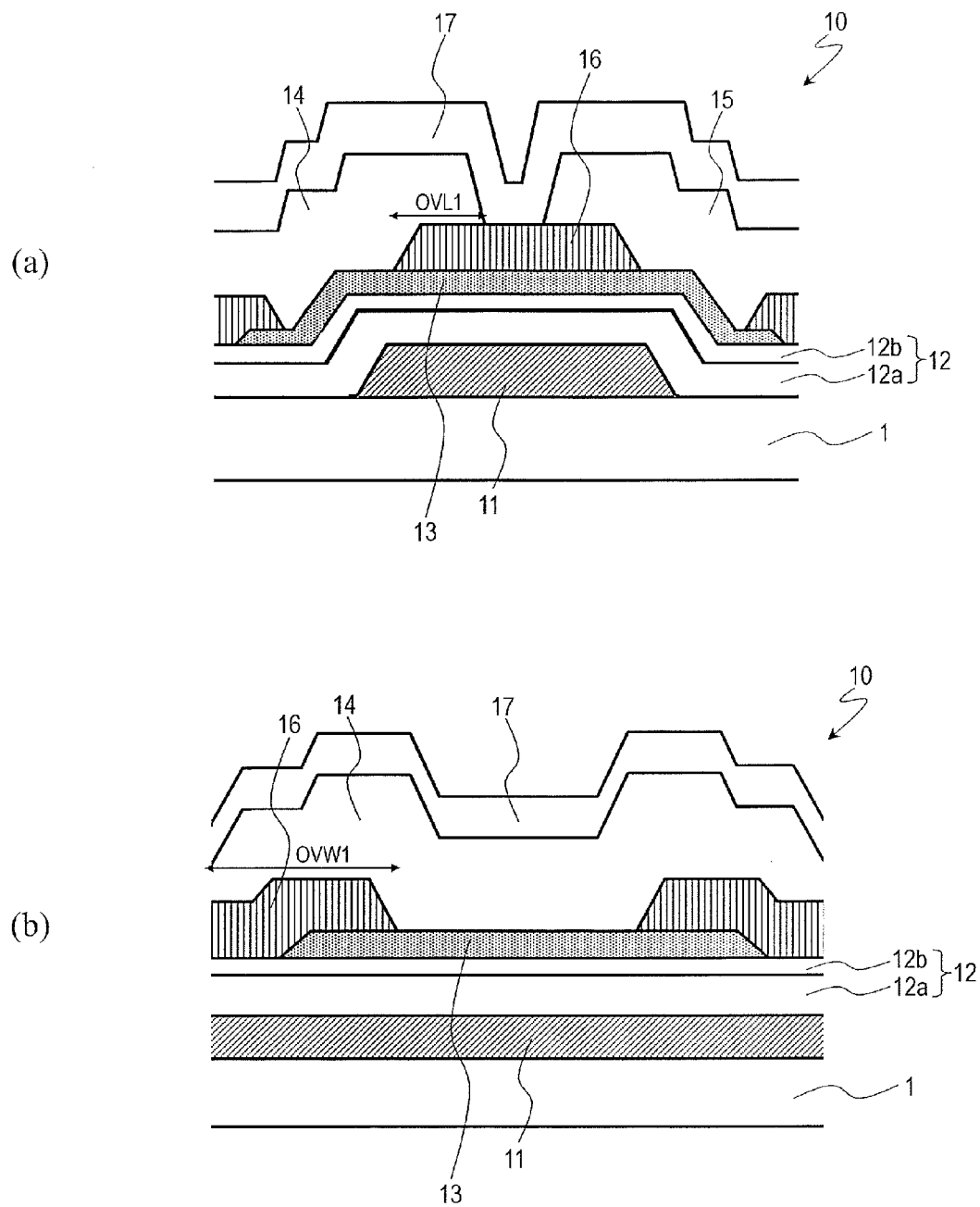
FIGS. 2 (a) and (b) are cross-sectional views schematically illustrating the thin-film transistor 10 as respectively viewed on the planes 2A-2A' and 2B-2B' shown in FIG. 1.

In the exemplary structure shown in FIG. 2 and other drawings, the gate insulating film 12 has a multilayer structure. However, the gate insulating film 12 may have a single-layer structure as shown in FIGS. 11(a) and 11(b). If the gate insulating film 12 has a single layer structure, the gate insulating film 12 is suitably an oxide layer such as an SiOx layer. By using an oxide layer as the gate insulating film 12, the oxygen deficiency of the oxide semiconductor layer 13 can be reduced, which is advantageous. On the other hand, if the gate insulating film 12 has a multilayer structure as shown in FIG. 2, the insulating layer in contact with the oxide semiconductor layer 13 (e.g., the second insulating layer 12b in the structure shown in FIG. 2) is suitably an oxide layer. Then, the same effect can also be achieved.

Figure 11:
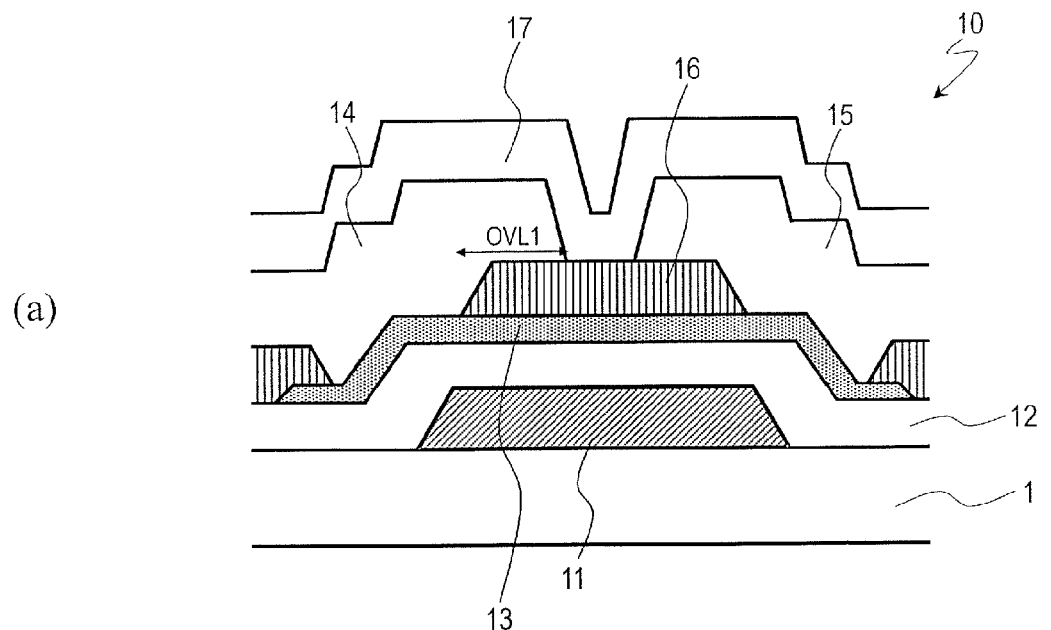
FIGS. 11 (a) and (b) are cross-sectional views schematically illustrating another configuration for the thin-film transistor 10 as respectively viewed on the planes 2A-2A' and 2B-2B' shown in FIG. 1.
Figure 11:
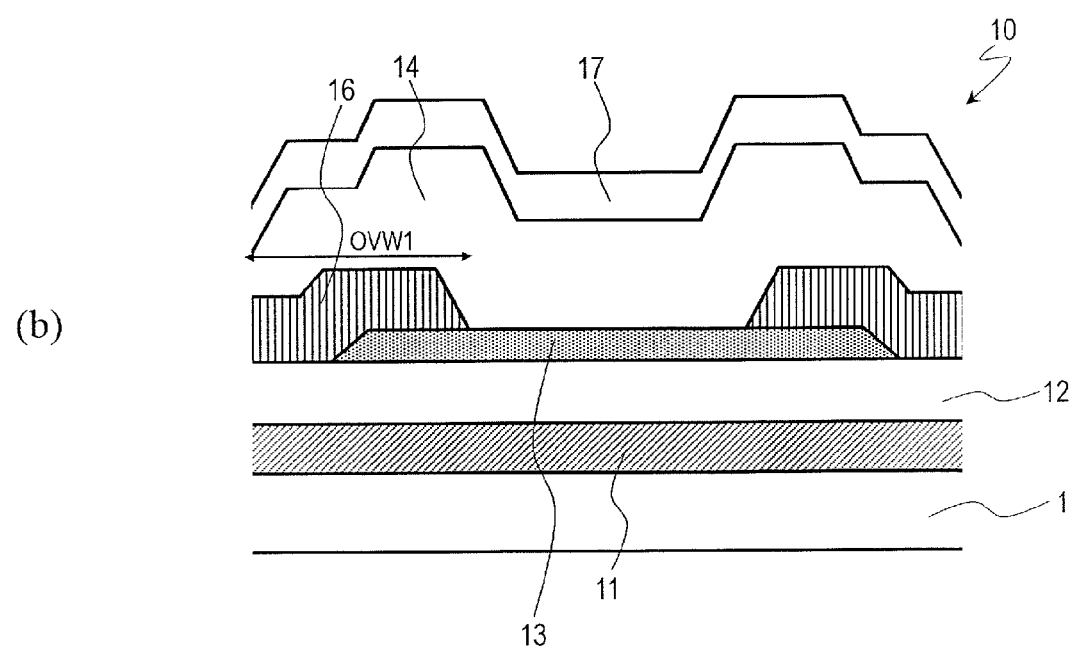
Figure 14:
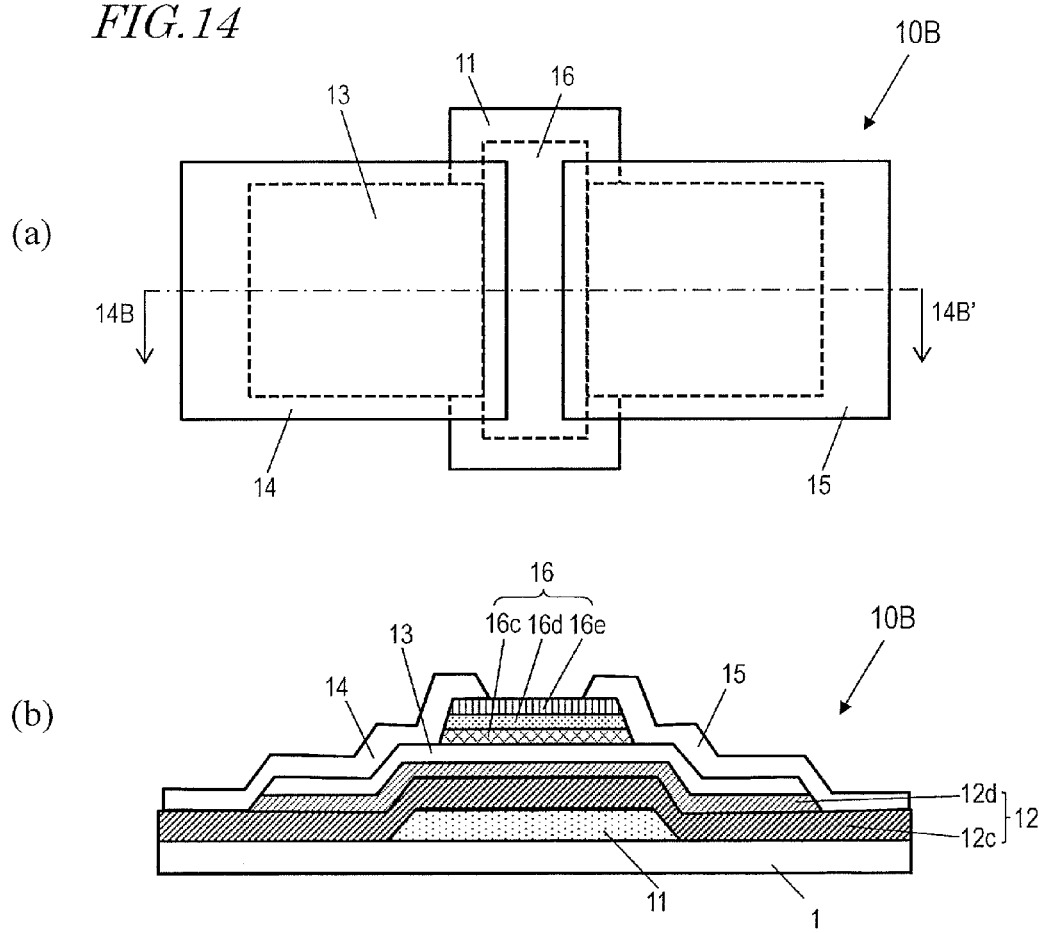
FIG. 14 (a) is a plan view schematically illustrating an oxide semiconductor TFT 10B disclosed in Patent Document No. 3, and (b) is a cross-sectional view as viewed on the plane 14B-14B' shown in (a).

Meanwhile, the gate insulating film 12 suitably has a single-layer structure as shown in FIG. 11 or a multilayer structure almost everywhere as shown in FIG. 2 and other drawings. In the oxide semiconductor 10C shown in FIG. 14, the gate insulating film 12 has a multilayer structure only in a region where there is the oxide semiconductor layer 13, but has a single-layer structure everywhere else. Such a structure can be obtained by etching the upper silicon oxide layer 12d. That is why as an additional process step of etching the silicon oxide layer 12d needs to be performed, the manufacturing cost would increase. In addition, since the silicon nitride layer 12c will also be etched when the silicon oxide layer 12d is etched, the level difference will grow. In that case, the coverage of the metal film to be the source and drain electrodes will decrease so much as to cause disconnection easily. However, such a problem can be avoided if the gate insulating film 12 has either a single-layer structure or a multilayer structure almost everywhere.

Figure 12:
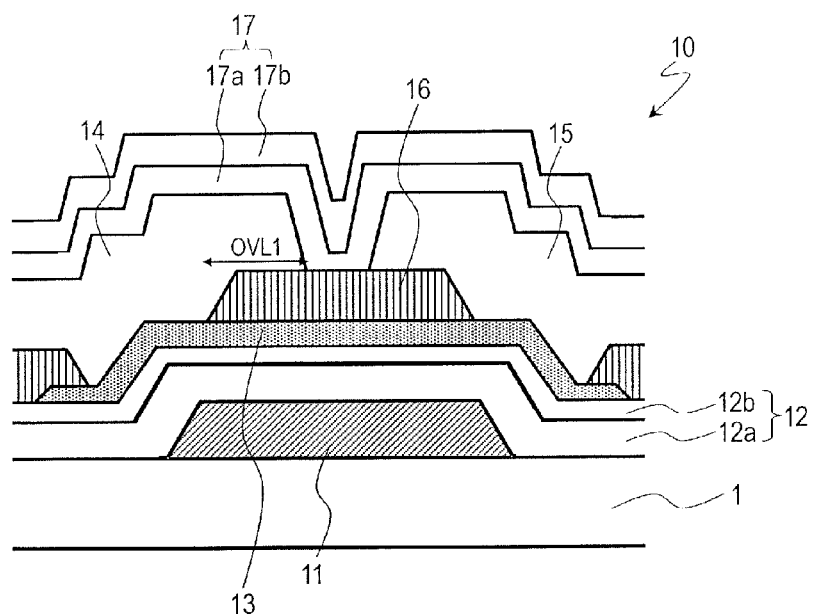
FIGS. 12 (a) and (b) are cross-sectional views schematically illustrating still another configuration for the thin-film transistor 10 as respectively viewed on the planes 2A-2A' and 2B-2B' shown in FIG. 1.
Figure 12:
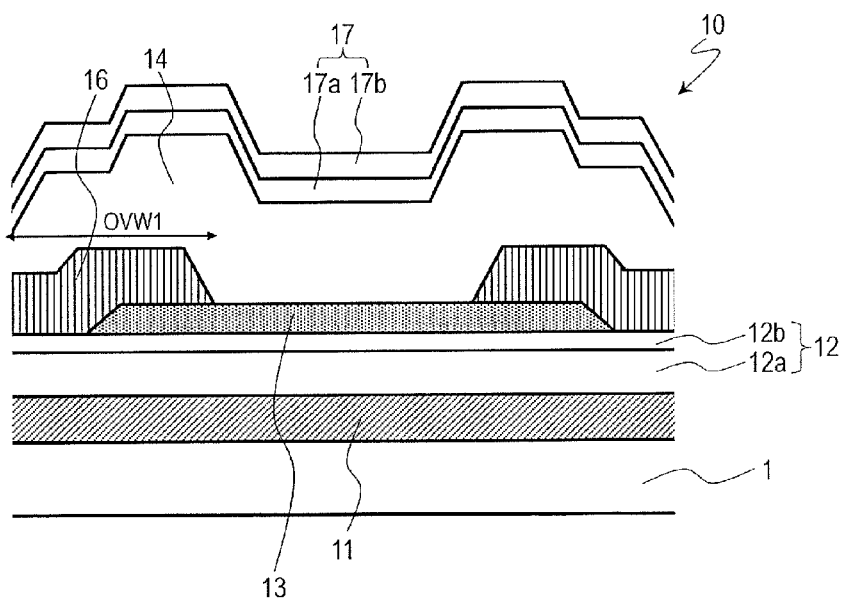
Figure 13:
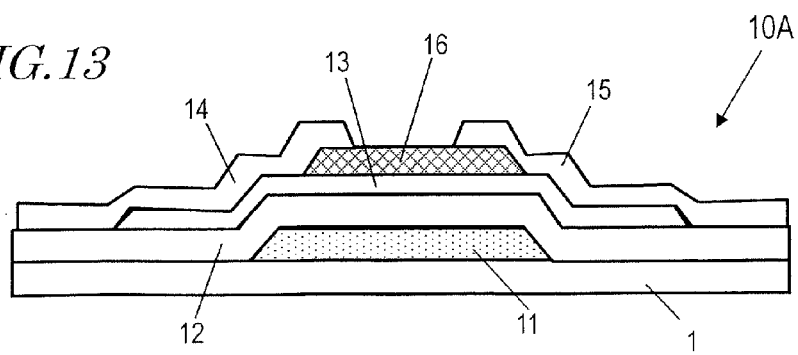
FIG. 13 A cross-sectional view schematically illustrating a conventional oxide semiconductor TFT 10A with a channel protective film.

In FIG. 2 and other drawings, the passivation film 17 that covers the source and drain electrodes 14 and 15 is supposed to have a single-layer structure as an example. However, a passivation film 17 with a multilayer structure may be provided as shown in FIGS. 12(a) and 12(b). The passivation film 17 shown in FIGS. 12(a) and 12(b) includes a silicon oxide layer 17a and a silicon nitride layer 17b which has been stacked on the silicon oxide layer 17a. By providing such a multilayer passivation film 17 including the silicon nitride layer 17b that can block water effectively, the humidity resistance can be further increased.

INDUSTRIAL APPLICABILITY

Embodiments of the present invention are applicable broadly to various types of devices that use a thin-film transistor. Examples of such devices include circuit boards such as an active-matrix substrate, display devices such as a liquid crystal display, an organic electroluminescence (EL) display, and an inorganic electroluminescence display, image capture devices such as an image sensor, and electronic devices such as an image input device and a fingerprint scanner. Embodiments of the present invention can be used particularly effectively in a liquid crystal display with a big monitor screen.

REFERENCE SIGNS LIST 1 substrate
10 thin-film transistor (oxide semiconductor TFT)
11 gate electrode
12 gate insulating film
13 oxide semiconductor layer
13s first contact region
13d second contact region
13c channel region
14 source electrode
15 drain electrode
16 protective film (channel protective film)
16a first hole
16b second hole
17 passivation film

The invention claimed is:

1. A semiconductor device comprising: a substrate; a gate electrode provided on the substrate; a gate insulating film formed on the gate electrode; an islanded oxide semiconductor layer formed on the gate insulating film and including a channel region and first and second contact regions that are arranged to interpose the channel region between them; a source electrode electrically connected to the first contact region; a drain electrode electrically connected to the second contact region; and a protective film formed on and in contact with the oxide semiconductor layer and arranged between the oxide semiconductor layer and the source and drain electrodes, wherein the upper and side surfaces of the oxide semiconductor layer are covered with the source electrode, the drain electrode and the protective film, and when viewed along a normal to the substrate, a narrowest gap between the respective outer peripheries of the first contact region and the source electrode and a narrowest gap between the respective outer peripheries of the second contact region and the drain electrode both have a length of 1.5 µm to 4.5 µm.

2. The semiconductor device of claim 1, wherein when viewed along a normal to the substrate, a gap between the respective outer peripheries of the first contact region and the source electrode and a gap between the respective outer peripheries of the second contact region and the drain electrode both have a length of 1.5 µm to 4.5 µm as measured in a channel length direction.

3. The semiconductor device of claim 1, wherein when viewed along a normal to the substrate, a gap between the respective outer peripheries of the first contact region and the source electrode and a gap between the respective outer peripheries of the second contact region and the drain electrode both have a width of 1.5 µm to 4.5 µm as measured in a channel width direction.

4. The semiconductor device of claim 1, wherein when viewed along a normal to the substrate, the narrowest gap between the respective outer peripheries of the first contact region and the source electrode and the narrowest gap between the respective outer peripheries of the second contact region and the drain electrode both have a length of 2.0 µm to 3.5 µm.

5. The semiconductor device of claim 1, wherein the protective film includes an oxide layer.

6. The semiconductor device of claim 5, wherein the protective film includes a silicon oxide layer.

7. The semiconductor device of claim 5, wherein the protective film includes neither an aluminum oxide layer nor a silicon nitride layer.

8. The semiconductor device of claim 1, wherein the gate insulating film has either a single-layer structure or a multi-layer structure.

9. The semiconductor device of claim 1, further comprising a passivation film formed so as to cover the source and drain electrodes,
wherein the passivation film includes a silicon oxide layer and a silicon nitride layer stacked on the silicon oxide layer.

10. The semiconductor device of claim 1, wherein the semiconductor device is an active-matrix substrate.

11. A display device comprising the semiconductor device of claim 10.

12. The semiconductor device of claim 1, wherein the oxide semiconductor layer is made of an In—Ga—Zn—O based semiconductor.

13. A method for fabricating a semiconductor device, the method comprising the steps of: (A) forming a gate electrode on a substrate; (B) forming a gate insulating film to cover the gate electrode; (C) forming an islanded oxide semiconductor layer on the gate insulating film; (D) forming a protective film with first and second holes on the oxide semiconductor layer; and (E) forming a source electrode and a drain electrode electrically connected to the oxide semiconductor layer through the first and second holes, respectively, wherein the steps (D) and (E) are performed so that the upper and side surfaces of the oxide semiconductor layer are covered with the source and drain electrodes and the protective film, and the step (E) is performed so that when viewed along a normal to the substrate, a narrowest gap between the respective outer peripheries of the first hole and the source electrode and a narrowest gap between the respective outer peripheries of the second hole and the drain electrode both have a length of 1.5 µm to 4.5 µm.

14. The method of claim 13, wherein the oxide semiconductor layer is made of an In—Ga—Zn—O based semiconductor.

* * * * *